US008716997B2

(12) United States Patent
Rao et al.

(10) Patent No.: US 8,716,997 B2
(45) Date of Patent: May 6, 2014

(54) HIGH POWER DC SSPC WITH CAPABILITY OF SOFT TURN-ON LARGE CAPACITIVE LOADS

(75) Inventors: Narendra Rao, Bangalore (IN); Vinod Kunnambath, Bangalore (IN); Prashant Purushotham Prabhu K, Bangalore (IN); Ezekiel Poulose Aikkaravelil, Chotanikara (IN); Randy Fuller, Hillsburgh, CA (US); Zhenning Liu, Mississauga, CA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 12/816,897

(22) Filed: Jun. 16, 2010

(65) Prior Publication Data

US 2011/0309809 A1 Dec. 22, 2011

(51) Int. Cl.
G05F 1/00 (2006.01)

(52) U.S. Cl.
USPC ........................................... 323/283; 323/266

(58) Field of Classification Search
USPC .......... 323/282–285, 234, 237, 241, 265, 266
See application file for complete search history.

(56) References Cited

U.S. PATENT DOCUMENTS

| | | | |
|---|---|---|---|
| 4,271,460 A | 6/1981 | Baker | |
| 4,513,343 A | 4/1985 | Ryczek | |
| 5,289,560 A * | 2/1994 | Abney | 388/811 |
| 5,388,022 A * | 2/1995 | Ahuja | 361/94 |
| 6,578,152 B1 * | 6/2003 | Burnside | 713/300 |
| 6,768,621 B2 | 7/2004 | Amundsen et al. | |
| 6,906,476 B1 | 6/2005 | Beatenbough et al. | |
| 7,355,368 B2 | 4/2008 | Salato et al. | |
| 7,538,454 B2 * | 5/2009 | Yu et al. | 307/100 |
| 2005/0213357 A1 * | 9/2005 | Paatero | 363/95 |
| 2006/0006850 A1 * | 1/2006 | Inoue et al. | 323/265 |
| 2006/0066112 A1 * | 3/2006 | Geis et al. | 290/52 |
| 2006/0200688 A1 * | 9/2006 | Tofigh et al. | 713/300 |
| 2007/0210765 A1 * | 9/2007 | Ming-Ching | 323/222 |
| 2008/0007241 A1 * | 1/2008 | Isham | 323/285 |
| 2008/0007265 A1 * | 1/2008 | Milne et al. | 324/347 |
| 2008/0258697 A1 | 10/2008 | Gehrke | |
| 2009/0112384 A1 * | 4/2009 | Jeon et al. | 701/22 |
| 2009/0212627 A1 | 8/2009 | Sakata et al. | |
| 2010/0134048 A1 * | 6/2010 | Pancani et al. | 315/307 |
| 2011/0084676 A1 * | 4/2011 | Lin et al. | 323/283 |

OTHER PUBLICATIONS

Revel, Pierre, "Electrical Distribution of High Power: Impacts, Technologies", More Electric Aircraft Forum, http://www.moetproject.eu, 2009.

* cited by examiner

Primary Examiner — Adolf Berhane
Assistant Examiner — Jeffrey Gblende
(74) Attorney, Agent, or Firm — Shimokaji & Assoc., P.C.

(57) ABSTRACT

Pre-charge circuitry allows capacitive loads connected to a solid state power controller to be gradually charged up by a PWM, generated with a cycle by cycle current limit, switching a single MOSFET in series with an inductor, before the SSPC is turned on. The pre-charge circuitry may require only three additional components, e.g., a MOSFET, an inductor and a diode, along with a designated MOSFET gate driver.

9 Claims, 4 Drawing Sheets

HIGH POWER DC SSPC WITH CAPABILITY OF SOFT TURN-ON LARGE CAPACITIVE LOADS

BACKGROUND OF THE INVENTION

The present invention relates to apparatus and methods for switching on power to a load and, more particularly, a high power direct current (DC) solid state power converter (SSPC) that is adapted to turn on large capacitive loads while minimizing peak inrush current.

When a DC SSPC is turned on to a large capacitive load, the peak inrush current can be very high. This is particularly true for SSPC's used in a high voltage DC primary power distribution system, where large energy storage components are connected to the DC power bus, and when multiple downstream SSPC channels are turned on simultaneously during power-up process. The excessive high inrush current could result in stress in electrical components during power-up, therefore reducing their operational life, potential electric hazards, and electromagnetic interference (EMI) issues.

In order to bypass this inrush current without causing the SSPC to trip, the instantaneous trip level of the SSPC has to be set higher than the peak of the inrush current. This means the SSPC has to be designed to be capable of handling even higher fault current, which puts more stringent requirements on the solid state switching device (SSSD) of the SSPC designs.

A conventional high power DC SSPC suitable for aircraft primary electric power distribution applications is shown in FIG. 1. The SSPC 100 may include a SSSD 102 for main bus power switching, an electromechanical contactor 104 for allowing the use of normally on semiconductors for the SSSD and the safe operation of the SSPC, two power bus current sensors 106, 108, a DSP based SSPC control engine 110, and a control power supply 112, providing necessary control power for the DSP based SSPC control circuitry, the SSSD gate drive, and contactor coil drive. The two power bus current sensors 106, 108 may be used to facilitate SSPC functions and differential current sensing required for primary bus power controls and management.

A conventional method for avoiding such high inrush current is to apply a pulse width modulated (PWM) drive to the SSPC turn-on process, or to repeatedly allow the SSPC to trip when its instantaneous current trip level has been reached and then to be turned back on again by sensing its rising output voltage, thereby gradually ramping up the load side voltage. Unfortunately, this technique may not work if full load current is present in addition to the potential excessive switching loss on the SSPC while attempting to charge the large capacitance ranging, e.g., from 500 µF to 1000 µF. The full load current may rapidly discharge the capacitor during the SSPC's off time. Unless the SSPC's off time is less than the on time, which is dependent on SSPC's instantaneous trip level and cannot be arbitrarily chosen, the capacitor will not charge up completely.

Another approach is through current limiting (either straight active current limiting or PWM based) in which the SSPC supplies a constant current on average, well in excess of its rating but below its instantaneous trip level, to turn on the capacitive load. With current limiting techniques, excessive power dissipation occurs on the solid state switching device (SSSD) of the SSPC during the current limiting process, which drives the size, weight and cost of the SSPC designs when the load capacitance becomes significantly large.

A foldback current limiting technique has been proposed for a DC SSPC implementation which actively controls the current supplied by the SSPC during turn-on to capacitive loads, making it inversely proportional to the voltage across the SSSD. Although this method ensures the maximum energy will be supplied to the capacitive load without violating the safe operating area (SOA) of the SSSD, there is no guarantee it will charge up an excessively large capacitive load with full load current present.

As can be seen, there is a need to provide a practical, reliable, and cost effective method that allows a DC SSPC, particularly a high power DC SSPC in an aircraft high voltage DC (e.g. 270 VDC) electric power architecture, to turn-on to large capacitive loads without causing excessive inrush currents for improved system reliability, safety, and EMI.

SUMMARY OF THE INVENTION

In one aspect of the present invention, a power controller comprises a pre-charge circuit connected in parallel with a switching device, wherein the pre-charge circuit includes a MOSFET receiving power from a main power bus at an input side of the switching device; an inductor in series with the MOSFET and to a load side of the switching device; and a diode connected between the MOSFET and the inductor.

In another aspect of the present invention, a solid state power controller comprises a DSP control engine including a coil driver and a pre-charge circuit gate driver; a solid state switching device receiving power from a main power bus; and a pre-charge circuit connected in parallel with the solid state switching device, wherein the pre-charge circuit includes a MOSFET receiving power from the main power bus at an input side of the switching device; an inductor in series with the MOSFET and to a load side of the switching device; and a diode connected between the MOSFET and the inductor, wherein the gate driver is adapted to control a switch of the MOSFET in a pulse width modulation fashion based on a current and voltage or current alone measurement on the load side of the switching device.

In a further aspect of the present invention, a method for limiting inrush current in a solid state power controller comprises receiving a turn-on command; issuing "off" logic to gate drivers of a solid state switching device and activate the pre-charge block; issuing a close logic to an electromechanical contactor connected in series with the solid state switching device; applying an initial pulse width modulation (PWM) logic to the gate driver of the pre-charge circuit MOSFET; measuring a load voltage (V) and current (I) or current alone (I) of the power controller; revising the PWM logic based on the measured voltage and current; and issuing an "on" logic to the gate driver of the solid state switching device when the measured load voltage of the power controller approaches an input voltage to the power controller or the block senses a timeout for its operation and the difference between output to input voltage is within threshold limits.

In a further aspect of the present invention, an early detection of load fault is detected by sensing the difference between input to output potential beyond the threshold limits.

In a further aspect of the present invention; a safe recovery from any brown out condition is achieved by switching back to the pre-charge circuit there by building back the safe potential on output.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide pre-charge circuitry to allow capacitive loads connected to a SSPC to be gradually charged up through a single MOSFET in series with an inductor, before the SSPC is turned on. The pre-charge circuitry may require as few as only three additional components—a MOSFET, an inductor and a diode—along with a designated MOSFET gate driver.

Figure 2:
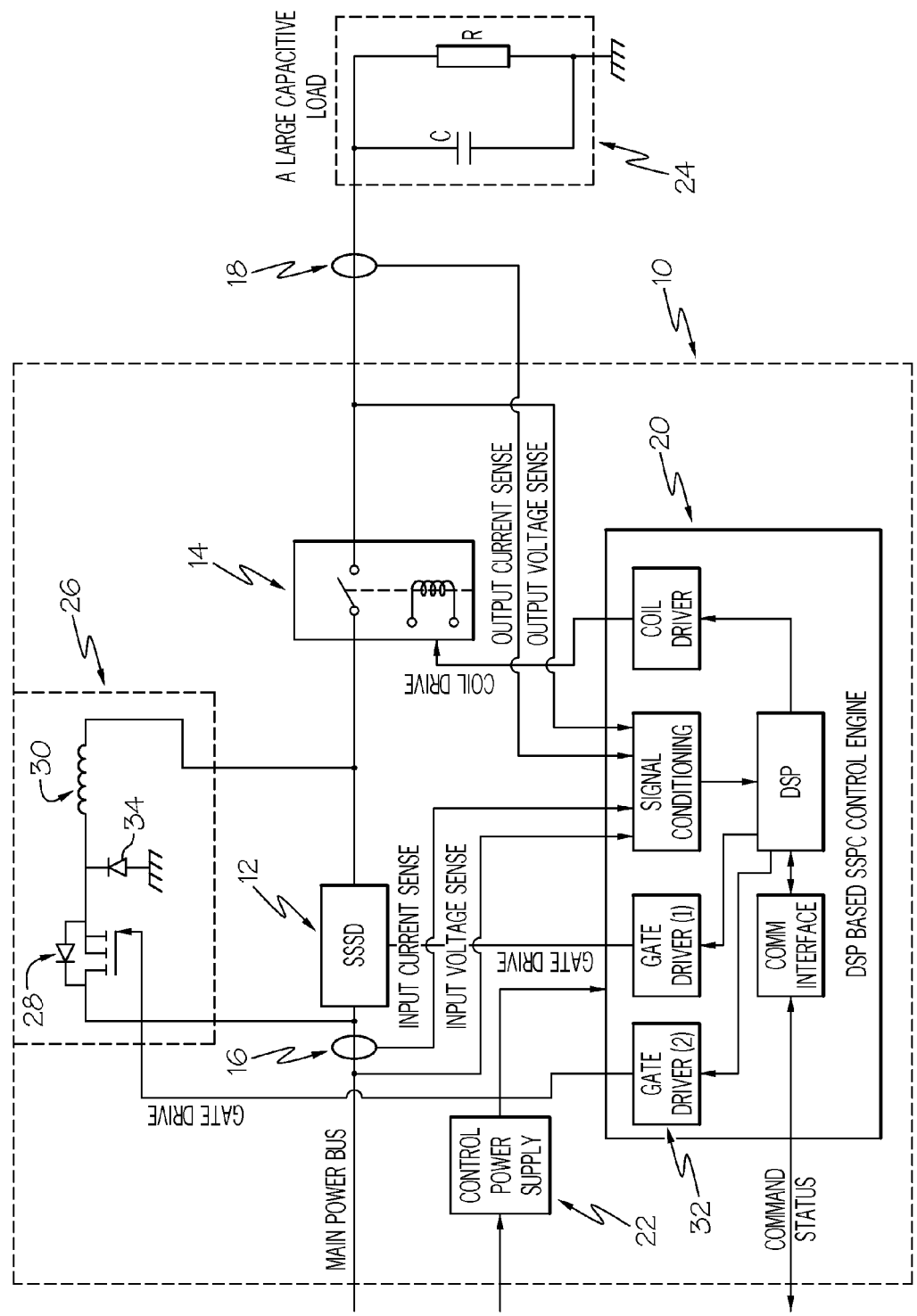
FIG. 2 is a circuit diagram for a high power DC SSPC with soft turn-on capability for aircraft primary electric distribution applications according to an embodiment of the present invention.

Referring to FIG. 2, a SSPC 10 may include a SSSD 12 for main bus power switching, an electromechanical contactor 14 for allowing the use of normally on semiconductors for the SSSD and the safe operation of the SSPC, two power bus current sensors 16, 18, a DSP based SSPC control engine 20, and a control power supply 22 for providing necessary control power for the DSP based SSPC control engine 20, the SSSD 12, and a coil driver 36 of the contactor 14. The two power bus current sensors 16, 18 may be used to facilitate SSPC functions and differential current sensing required for primary bus power controls and management.

The SSSD 12 responsible for the main bus power switching can be formed by either conventional MOSFETs, or MOSFETs in combination with IGBTs for relatively low power rating applications (e.g. for feeder line control), or by emerging new "normally on" semiconductor devices such as GaNpowIR™ and SiC based VJFET, etc., for high power applications (e.g. for main power source and bus tie controls).

In order to facilitate the "soft turn-on" to large capacitive loads 24, an additional pre-charge circuitry 26 may be introduced to the high power DC SSPC 10 in parallel with the SSSD 12, as shown in FIG. 2.

The pre-charge circuitry 26 may allow the capacitive loads 24 connected to the SSPC 10 to be gradually charged up through a single MOSFET 28 in series with an inductor 30, before the SSPC 10 is turned on. The inductor 30 may serve as an active component that may limit the inrush current but does not result in power dissipation.

The SSPC 10 may take advantage of existing DSP based SSPC platforms (100, see FIG. 1) with the DSP based control engine 20 and the real time load voltage and current monitoring. The pre-charge circuitry 26 can be operated (or controlled) as a DC/DC converter, in that a newly added gate driver 32 may control the MOSFET 28 switch in a PWM fashion, based on the output voltage and current sense signals. When the MOSFET 28 is in the "ON" state, the capacitive load 24 may charge from the power source 22 through the inductor 30, thereby limiting the excessive inrush current. When the MOSFET 28 is in the "OFF" state, the energy stored in the inductor 30 may discharge to the capacitive load 24 through the path provided by a freewheeling diode 34, thus keeping a sustained and controlled energy flow to the capacitive load 24 until it is fully charged.

Figure 1:
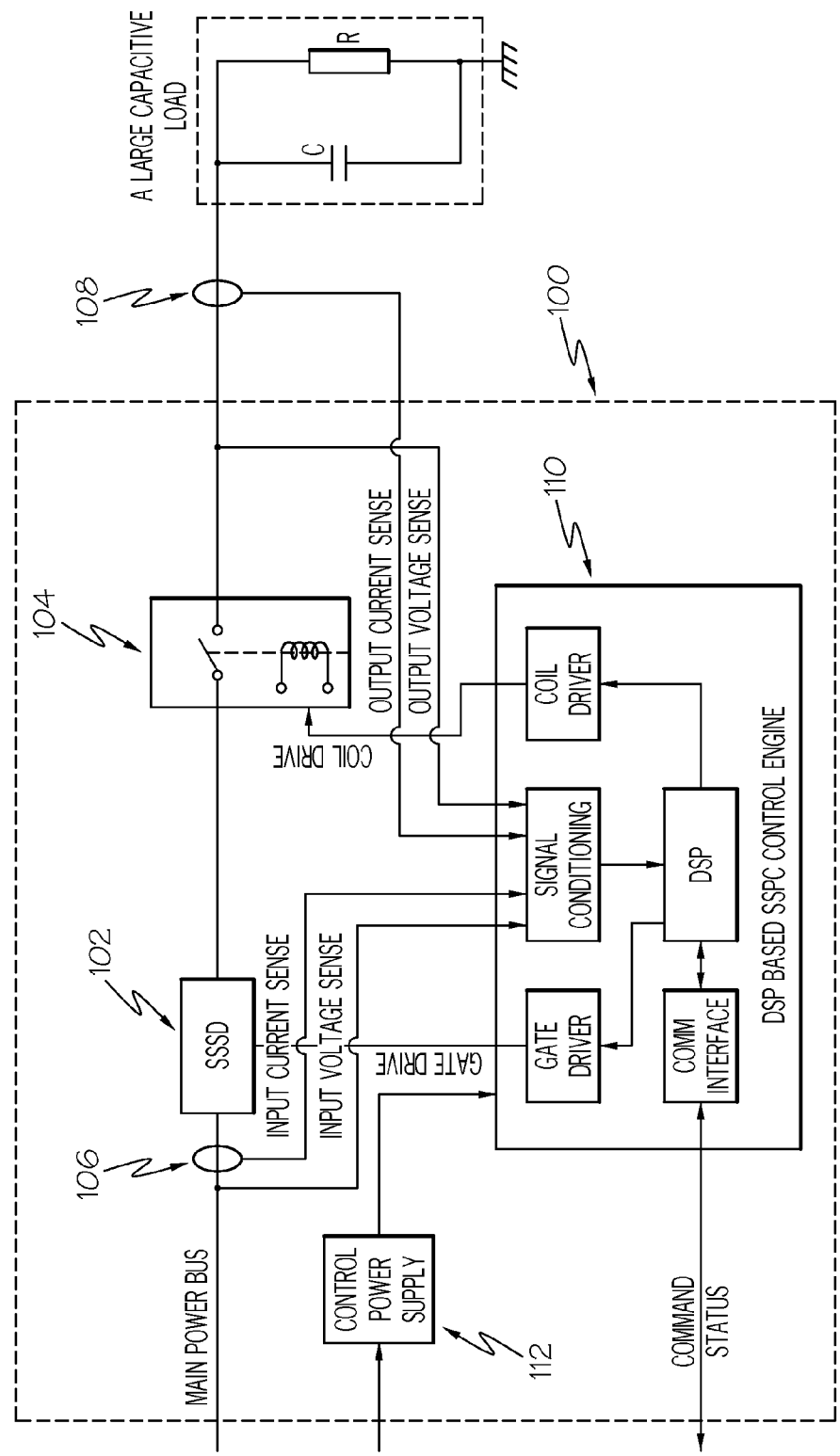
FIG. 1 is a circuit diagram for a conventional high power DC SSPC for aircraft primary electric power distribution applications according to the prior art.

Exemplary embodiments of the present invention may require as few as only three additional components, as described above, along with the designated MOSFET gate driver 32, which is at least the same as, if not much simpler than, a gate driver 36 used for the SSSD 12 in a conventional SSPC configuration (100, see FIG. 1). Since none of these added components need be subject to any excessive stress due to introduction of the inductor 30 and proper controls, embodiments of the present invention may be more reliable, efficient, and easily implementable.

In a 270 VDC aircraft primary power distribution system, a typical 35 KW rated capacitive load can be equivalently expressed as a 2.1 Ω resistor connected in parallel with a 600 µF capacitor. For such a large capacitive load, with almost 130 A nominal load current, any conventional current limiting based methods will be impractical due to excessive power dissipation in the SSSD. Using the pre-charge circuitry 26 of the illustrated embodiment, the maximum 10 KHz switching frequency (for the MOSFET 28) can be selected. Assuming the maximum allowed inrush current limit is 200 amps (A), an inductor value of about 50-90 micro Henry (µH), typically about 68 µH, may be used in the pre-charge circuitry 26. The copper for the inductor 30, along with the MOSFET 28, freewheeling diode 34, and even the printed wire board (PWB) traces can all be selected according the $I^2t$ rating, due to the short duration of the "pre-charging" process. The selection of the inductor core depends on the peak current. A core with larger air gap, and hence larger reluctance, could be used in the pre-charge circuitry 26 according to an exemplary embodiment of the present invention.

It should be pointed out that the proposed pre-charge circuitry 26 need not be limited to the topology shown in FIG. 2. Any DC/DC converter topology, whether it's operated in current mode or voltage mode, making use of the DSP based SSPC platform shown in FIG. 1, can be adopted to facilitate the function of "soft turn-on" to a capacitive load.

One intention of above mentioned control strategy may be to ensure that the SSPC 10 can act as a "normally off" switch, the electromechanical contactor 14 doesn't close to any significant current during normal SSPC operations, the contactor 14 may serve as a leakage current isolator and a secondary means for over current fault isolation, and the SSSD 12 may only be closed after the controlling large capacitive load 24 has been charged up through the pre-charge circuitry 26. The rest of control strategy need be no different from any other SSPC.

It should be pointed out that, due to introduction of the pre-charging process for the capacitive load 24, severe over current fault at the load side (for example, at current measurement device 18) can be detected during the pre-charging process through continuous monitoring of the load voltage establishment, without any circuit component being actually stressed by the potential fault current, which may improve the system reliability.

Figure 3:
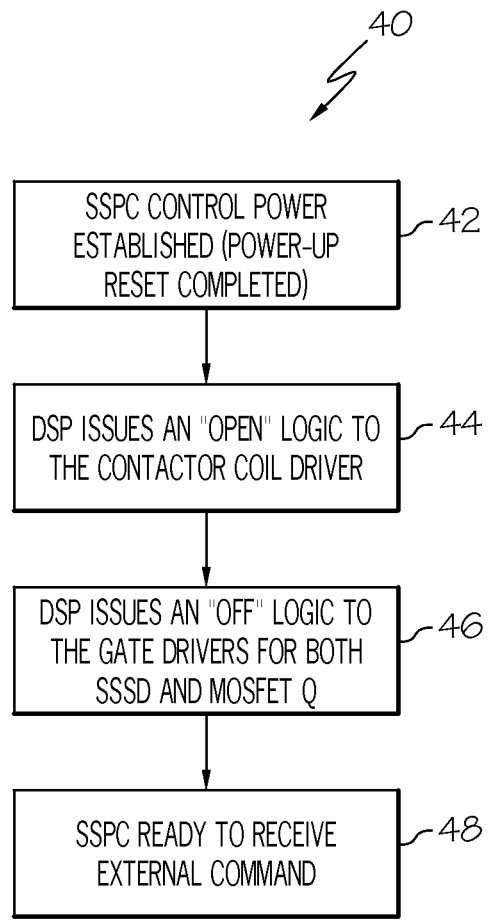
FIG. 3 is a flow chart describing an initial power-up method for the SSPC of FIG. 2.

Referring to FIG. 3, a flow chart 40 describes initial SSPC power-up. Once SSPC control power is established at step 42, a DSP (e.g., DSP 20) may issue an "open" logic to a contactor coil driver (e.g., coil driver 36) at step 44. The DSP may issue, at step 46, "off" logic to the gate drivers for both the SSSD (e.g., SSSD 12) and the MOSFET (e.g., MOSFET 28). At this stage, step 48, the SSPC may be ready to receive an external command.

Figure 4:
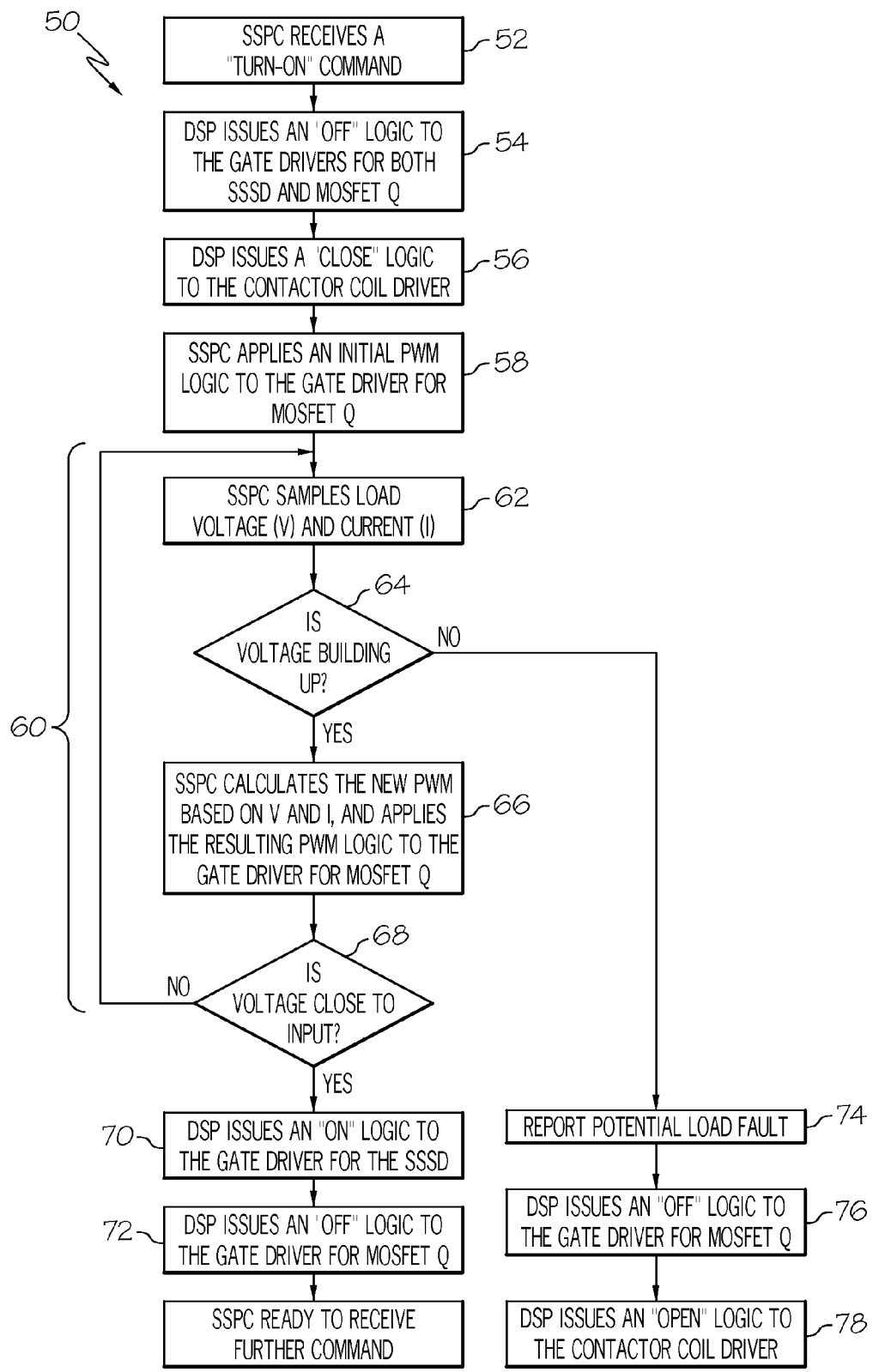
FIG. 4 is a flow chart describing a method of commanding "on" the SSPC of FIG. 2.

Referring to FIG. 4, a flow chart 50 describes a process for commanding "on" an SSPC. When the SSPC 10 receives a turn-on command (block 52), the DSP 20 may issue, at step 54, an "off" logic to the gate drivers for both the SSSD 12 and the MOSFET 28 of the pre-charge circuit 26. The DSP may also issue, at step 56, a "close" logic to the contactor coil driver 36. At step 58, the SSPC 10 may apply an initial PWM logic to the gate driver 32 of the MOSFET 28.

Following this step 58, a loop 60 may be run in which the SSPC may sample load voltage (V) and current (I) at step 62. If the voltage is building up (as determined from decision block 64), then the SSPC may calculate, at step 66, a new PWM based on V and I, and may apply the resulting PWM logic to the gate driver for MOSFET 28. A decision block 68 may then determine whether the load voltage (V) is close to an input voltage into the SSPC 10. If this is not the case, then the loop 60 repeats back to step 62. If this is the case, then the DSP may issue an "on" logic to the gate driver for the SSSD 12 at step 70 and the DSP may issue an "off" logic to the gate driver for the MOSFET 28 at step 72. At this point, the SSPC 10 may be ready to receive further commands.

Referring back to decision block 64, if the voltage is not building up, then a potential load fault may be reported at step 74 and the DSP may issue an "off" logic to the gate driver for the MOSFET 28 at step 76. Finally, at step 78, the DSP may issue an "open" logic to the contactor coil driver 36.

It should be understood, of course, that the foregoing relates to exemplary embodiments of the invention and that modifications may be made without departing from the spirit and scope of the invention as set forth in the following claims.

We claim:

1. A solid state power controller (SSPC) comprising:
   a pre-charge circuit connected in parallel with a solid state switching device, wherein the pre-charge circuit includes:
      a MOSFET receiving power from a main power bus at an input side of the solid state switching device;
      an inductor in series with the MOSFET and to a load side of the solid state switching device; and
      a freewheeling diode connected between the MOSFET and the inductor; and
   a gate driver integral to a DSP control engine of the power controller, the gate driver coupled to the MOSFET and configured to control a switch of the MOSFET of the pre-charge circuit in a pulse width modulation fashion based on a sampled load voltage measurement to apply an on logic to the MOSFET until the sampled load voltage reaches an input voltage of the SSPC and to apply an off logic to the MOSFET when the sampled load voltage reaches the input voltage of the SSPC.

2. The power controller of claim 1, wherein the solid state switching device is selected from the group consisting of a MOSFET, an IGBT, a GaN based switching device, and a SiC based VJFET.

3. The power controller of claim 1, wherein the inductor has an inductor value of about 68 μH.

4. The power controller of claim 1, wherein the switching device is a normally closed solid state switching device.

5. The power controller of claim 4, including an electromechanical contactor in series with the switching device.

6. The power controller of claim 5, wherein a load side of the inductor is electrically connected between the solid state switching device and the electromechanical contactor.

7. A solid state power controller comprising:
   a DSP control engine including a coil driver and a pre-charge circuit gate driver;
   a solid state switching device receiving power from a main power bus; and
   a pre-charge circuit connected in parallel with the solid state switching device, wherein the pre-charge circuit includes:
   a MOSFET receiving power from the main power bus at an input side of the switching device;
   an inductor in series with the MOSFET and to a load side of the switching device;
   a freewheeling diode connected between the MOSFET and the inductor;
   a first gate driver is integral to a DSP control engine of the power controller and coupled with the MOSFET, the first gate driver configured to apply:
      an on logic to the MOSFET until the sampled load voltage reaches an input voltage of the SSPC,
      an off logic to the MOSFET when the sampled load voltage reaches the input voltage of the SSPC, and
      an off logic to the MOSFET in response to the load voltage failing to reach the input voltage at a desired rate; and
   a second gate driver coupled with the solid state switching device, the second gate driver configured to apply an on logic to the solid state switching device in response to the load voltage reaching the input voltage.

8. The solid state power controller of claim 7, wherein the inductor has an inductor value from about 50 to about 90 μH.

9. The solid state power controller of claim 7, including an electromechanical contactor in series with the solid state switching device.

* * * * *